(12) United States Patent
Stach et al.

(10) Patent No.: US 6,662,661 B2
(45) Date of Patent: Dec. 16, 2003

(54) METHOD OF MEASURING OSCILLATORY SEMICONDUCTOR MEMBRANES AND SHIELDING FOR EXTERNAL EXCITATIONS IN THE MEASUREMENT

(75) Inventors: Gerd Stach, Hüttenberg (DE); Thomas Struck, Olching (DE)

(73) Assignee: Leica Microsystems Semiconductor GmbH, Wetzlar (DE)

( * ) Notice: Subject to any disclaimer, the term of this patent is extended or adjusted under 35 U.S.C. 154(b) by 0 days.

(21) Appl. No.: 10/100,243

(22) Filed: Mar. 18, 2002

(65) Prior Publication Data

US 2002/0167666 A1 Nov. 14, 2002

Related U.S. Application Data

(63) Continuation of application No. PCT/EP00/08791, filed on Sep. 8, 2000.

(30) Foreign Application Priority Data

Sep. 16, 1999 (DE) .......................... 199 44 474

(51) Int. Cl.[7] .................................. G01N 9/19
(52) U.S. Cl. ......................................... 73/655
(58) Field of Search ..................... 73/655, 579, 596; 428/14; 378/35

(56) References Cited

U.S. PATENT DOCUMENTS

| | | | |
|---|---|---|---|
| 5,546,811 A | * | 8/1996 | Rogers et al. ............... 73/800 |
| 5,793,836 A | | 8/1998 | Maldonado et al. .......... 378/35 |
| 5,809,103 A | | 9/1998 | Smith et al. .................. 378/35 |
| 6,149,992 A | * | 11/2000 | Nakayama .................... 428/14 |
| 6,477,898 B1 | * | 11/2002 | Han et al. ..................... 73/579 |

OTHER PUBLICATIONS

Article—"Stencil Mask Technology For Ion Beam Lithography", Albrecht Ehrmann, et al., 12 pages.

VDI/VDE–Richtlinien 3717, Mar. 1999.

Article—"Pellicles for X–Ray Lithography Masks", J.R. Maldonado et al., SPIE vol 3331, pp. 245–254.

* cited by examiner

Primary Examiner—Hezron Williams
Assistant Examiner—Tamiko Bellamy
(74) Attorney, Agent, or Firm—Foley & Lardner

(57) ABSTRACT

The method enables optical measurements of an oscillatory, and particularly structured, membrane in an environment which is subjected to gas flows and/or acoustic excitations. A device for measuring the membrane is focused on the same. An optically transparent film is provided, and the film and the membrane are arranged in such a manner that the gas flows and/or the acoustic excitations reach the membrane only by passing through the film. The film enables a diminishing of the external air movements and thus oscillations of the membrane so that the membrane can be precisely measured.

20 Claims, 3 Drawing Sheets

$3\sigma_X = 2.73 nm$
$3\sigma_Y = 3.56 nm$

METHOD OF MEASURING OSCILLATORY SEMICONDUCTOR MEMBRANES AND SHIELDING FOR EXTERNAL EXCITATIONS IN THE MEASUREMENT

CROSS-REFERENCE TO RELATED APPLICATION

This application is a continuation of copending International Application No. PCT/EP00/08791, filed Sep. 8, 2000, which designated the United States.

BACKGROUND OF THE INVENTION

1. Field of the Invention

The invention relates to a method for optically measuring a oscillatory and preferably structured membrane in an environment which is exposed to gas streams and/or acoustic excitations, wherein a device is focused on the membrane in order to measure it. The invention also relates to utilizing a pellicle in the above method for the purpose of damping and/or shielding gas streams and/or acoustic excitations.

In the course of progressive miniaturization in semiconductor fabricating technology, techniques such as electron or ion beam lithography are being increasingly applied instead of optical exposure techniques, with which it is only possible to generate microstructures up to the size of the utilized wavelength. For instance, ions are projected onto a mask which is perforated with structure-forming openings through which the ions reach the substrate that will be exposed, where they form an image of the mask structure. The stencil masks utilized in this technique are produced from semiconductor substrates, which are etched from the back side nearly to the margin, leaving a residual thickness of typically 3 μm, and which include the structure-forming openings in this region. Prior to the exposure process, the stencil masks, specifically their 3-μm-thick membranes, are measured for control purposes. The fabrication and measuring of stencil masks is described in "Stencil Mask Technology for Ion Beam Lithography" (*Proceedings of BACUS* (Bay Area Chromemask User Symposium, California), SPIE 1998).

The substrates utilized therein, which have a diameter of 150 nm, have a membrane with a diameter of 126 nm. Test structures are disposed on the membrane whose position is optically measured.

The measurement of the structures takes place in the clean rooms that are built for semiconductor fabrication, wherein an upward laminar flow of air effectuates a continuous air filtration and purification. The airflow leads to problems in the measurement of the above mentioned semiconductor membranes of stencil masks. The membranes, being only a few microns (μm) thick and furthermore being perforated by a number of structural openings and therefore extremely instable, are very easily excited into vibration by air movements. In the measurement of such a membrane, a measuring device must be focused on the membrane plane. When the membrane plane vibrates vertically, for instance, besides unsharpnesses, horizontal position displacements of the structural openings which are to be measured also occur. Besides being induced by air movements, these measurement errors are also acoustically induced. But these acoustic or flow-related air movements above the membrane being measured cannot be shielded by non-vibrating media such as glass wafers or quartz substrates, because utilizing these would impair the quality of the optical imaging and would complicate focusing.

Measuring is thus complicated by the membrane vibrations which occur, or is no longer reproducible given the exceeding of a defined excursion. Above all, membranes having a very small mechanical initial tension and a correspondingly small distortion cannot yet be measured by conventional means owing to their large vibration amplitudes. It is therefore necessary to find a method which makes possible, or makes easier, a reproducible measurement of vibrating membranes.

On the other hand, so-called "pellicles" (i.e. optically transparent films which are stretched on a frame) are used in semiconductor fabrication. In the optical exposure, pellicles are installed through a reticle, i.e. through a quartz plate which is covered by a structured chrome layer, onto same, and serve to keep small particles from the structured chrome layer. Particles occurring in clean rooms do not settle on the reticle but rather several millimeters above it on the pellicle film, and they do not cause fading or scattering of the light beam in the optical imaging. The pellicle thus keeps microparticles and other impurities from the reticle surface.

The utilization of pellicles is described in VDI/VDE Richtlinien 3717, p. 6 (March 1999) (see *VDI/VDE-Handbuch Mikro- und Fernwerktechnik*). The described pellicles have a film thickness from 0.8 to 2.85 μm and are used for optical exposure with wavelengths between 360 and 450 nm.

SUMMARY OF THE INVENTION

It is accordingly an object of the invention to provide a method, which overcomes the above-mentioned disadvantages of the heretofore-known devices and methods of this general type and which renders it possible to measure, with greater reliability and accuracy, vibrating, and particularly structured, membranes, particularly of stencil masks. It should be possible to carry out this method simply, economically, and as far as possible with the aid of conventional devices for measuring massive and therefore barely oscillatory reticles.

With the foregoing and other objects in view there is provided, in accordance with the invention, a membrane measurement method, which comprises:

providing an oscillatory membrane (in particular a structured membrane) in an environment that subjects the membrane to oscillatory excitations (e.g., gas flows and/or acoustic excitations);

providing an optically transparent film and arranging the membrane and the film such that the oscillatory excitations reach the membrane substantially only through the film; and focusing a device for optically measuring the membrane onto the membrane, and measuring the membrane.

In other words, the objects of the invention are achieved in that an optically transparent film is provided, and the film and membrane are arranged in such a way that the gas streams and/or acoustical excitations reach the membrane only through the film.

Although the film is just as thin as, or as emerges from the above cited VDI/VDE guidelines, even thinner than the membrane, and therefore is itself able to vibrate, the acoustic and air vibrations and therefore also the vibrations of the membrane are damped enough that a reliable measurement result is achieved, or in many cases a measurement is possible in the first place.

The term "oscillatory" membrane is to be understood to mean that the membrane is capable of oscillating and/or vibrating, especially when excited on being subjected to a gas flow and/or an acoustic excitation.

A preferred embodiment provides that the membrane be placed on a base, which is impermeable to the gas flows and/or acoustic excitations, and covered with the film, so that it is encapsulated by the base and the film. Depending on the film mounting, the base can be flat on the side facing the membrane or can have an elevated margin. According to a preferred embodiment, the base comprises a closed, non-oscillatory plane surface under the membrane. Given placement of the membrane onto the plane surface, and of the film—or rather the frame bearing the film—onto the membrane or the plane surface, vibration-exciting influences can reach the membrane only through the film.

Preferred embodiments with respect to the film provide that the film consist substantially of nitro-cellulose; that it be less than 5 μm thick; and that it be a pellicle, i.e. a component of a pellicle. The pellicles customarily utilized for protecting chrome reticles from particulate contamination can be misappropriated for suppressing membrane vibrations, whereby a particularly simple and economical shielding of the membrane is achieved.

Preferred embodiments with respect to the membrane provide that the membrane be a stencil mask, and that it consist substantially of silicon.

The membrane is preferably mounted horizontally, and in this orientation lateral position deviations of membrane structures are measured, which occur as a consequence of the causes of error that are to be controlled as well as the vertical membrane vibrations.

With the aid of the film, i.e. the pellicle, in many cases it is possible to utilize measuring devices which are designed solely for measuring non-oscillatory objects such as chrome masks or massive semiconductor substrates, and with which only poor measurement results, if any, can be otherwise achieved.

The inventive utilization of a pellicle in the method herein described for the purpose of damping or shielding air movements, such as those produced by the laminar gas flow which prevails in clean rooms or by acoustic effects, makes it possible to realize a more precise measuring method by conventional means at no additional cost.

Other features which are considered as characteristic for the invention are set forth in the appended claims.

Although the invention is illustrated and described herein as embodied in shielding external excitations in the measurement of oscillatory semiconductor membranes, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
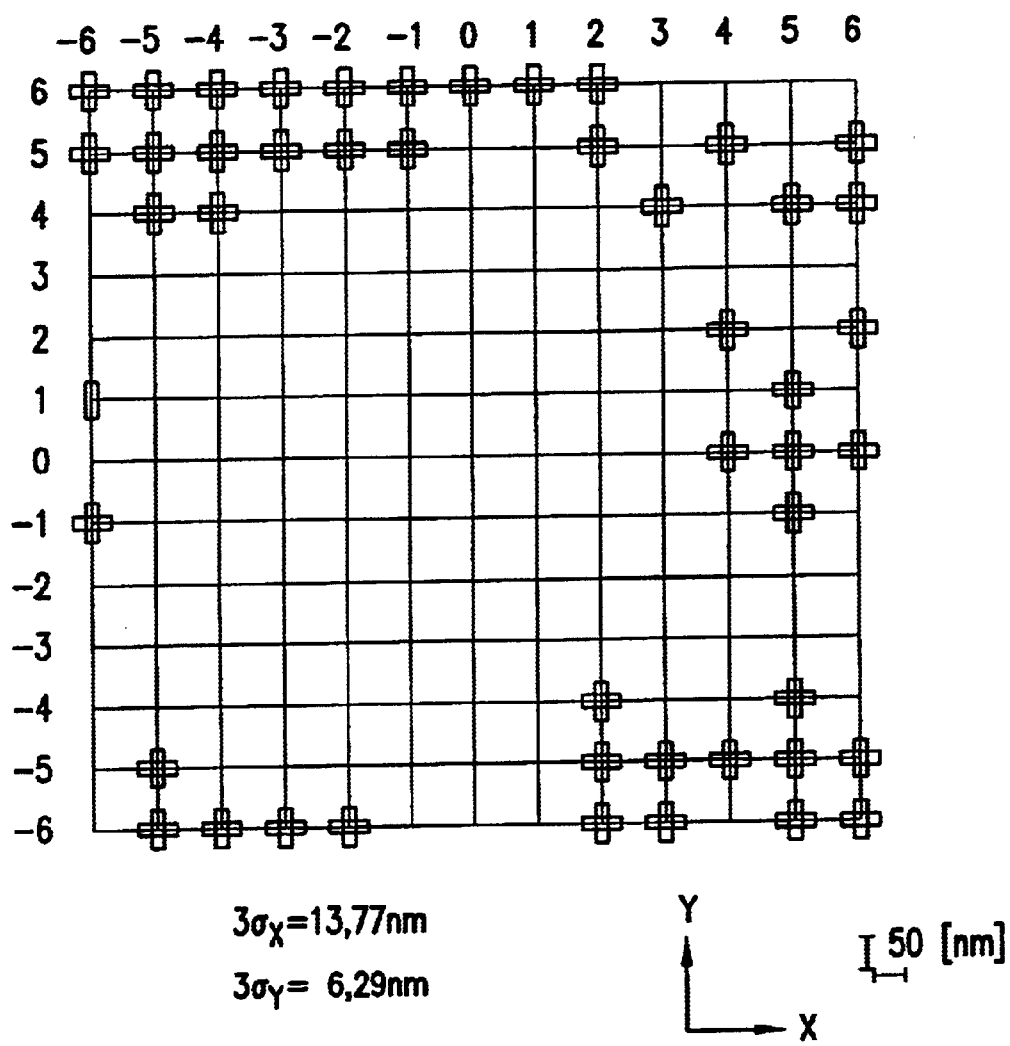
FIGS. 1 and 2 are schematic plane views of a membrane, illustrating lateral excursions of the membrane measured with and without a pellicle placed over the membrane.

Referring now to the figures of the drawing in detail and first, particularly, to FIG. 1 thereof, there is shown a grid of markings arranged in intervals of 5 mm (0.2 in) on a 6×6 cm section of a membrane of a 6-inch wafer. The representation of the lateral excursions is not true to scale; the applicable scale represents an excursion of 50 nanometers. Points which are not measured or which are measured in only one direction are represented by one rectangle or two crossing rectangles, respectively.

The points were each measured 20 times, and average values were formed for each point of the grid. Comparison of the points to one another yields a value of 13.77 nanometers for the grid point with the farthest excursion in a direction x for the threefold standard deviation as the measure of lateral deviation. For the excursion in a direction y, a value of 6.29 nanometers is obtained as triple the standard deviation of the grid point with the farthest excursion.

Figure 2:
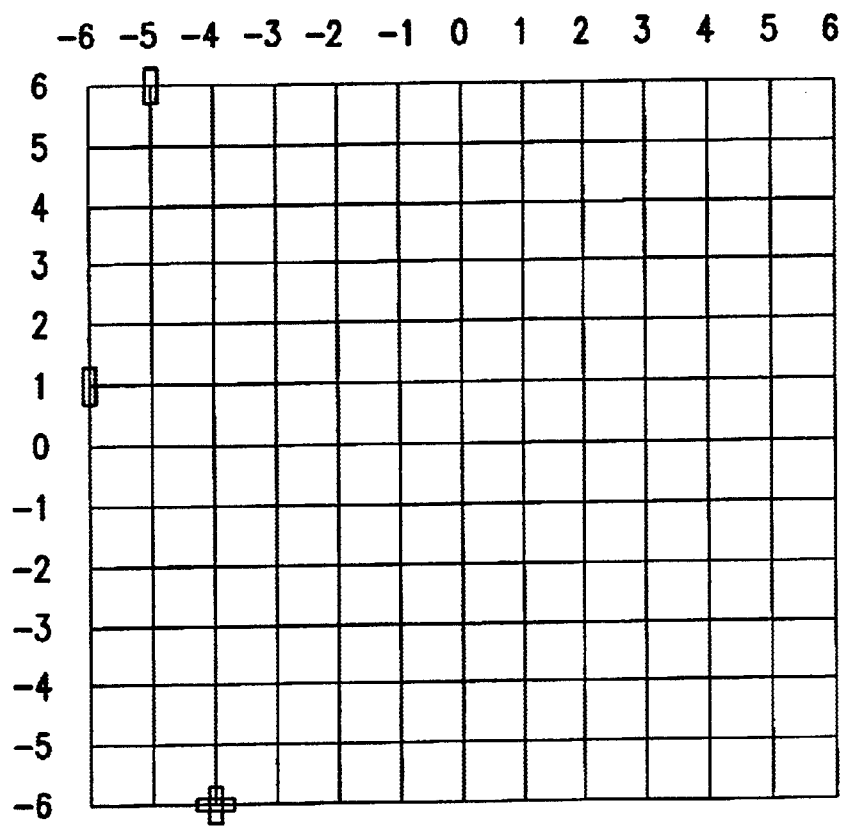

FIG. 2 shows the measured excursions of the membrane given utilization of a commercial pellicle. The lateral excursions are significantly smaller compared to FIG. 1. The 3-fold value of the standard deviation $\sigma_x$ for the point with the farthest excursion in the direction x is 2.73 nanometers; $3\sigma_y$ for the direction y it is 3.56 nm. The measurement reproducibility which is achievable this way is some 3 nanometers, in contrast to approx. 12 nanometers without a pellicle.

Figure 3:
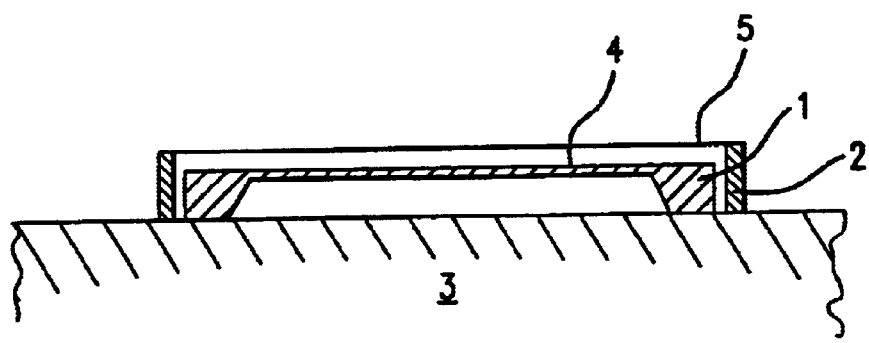
FIG. 3 is a schematic side view of an assembly of the membrane and the pellicle on a base.

FIG. 3 represents a stencil mask 1 with a semiconductor membrane 4. The mask rests on a base 3, which cannot be placed into vibration, at least not by the air currents and acoustic excitations prevailing in clean rooms. The base can be a quartz glass substrate, for example. A pellicle 2 is laid on the support 3. The pellicle 2 encapsulates the stencil mask between the pellicle film 5 and the base 3. The membrane of the stencil mask 1 is shielded from external vibrations by the pellicle margin and the base 3; these can reach the membrane only through the pellicle film.

Figure 4:
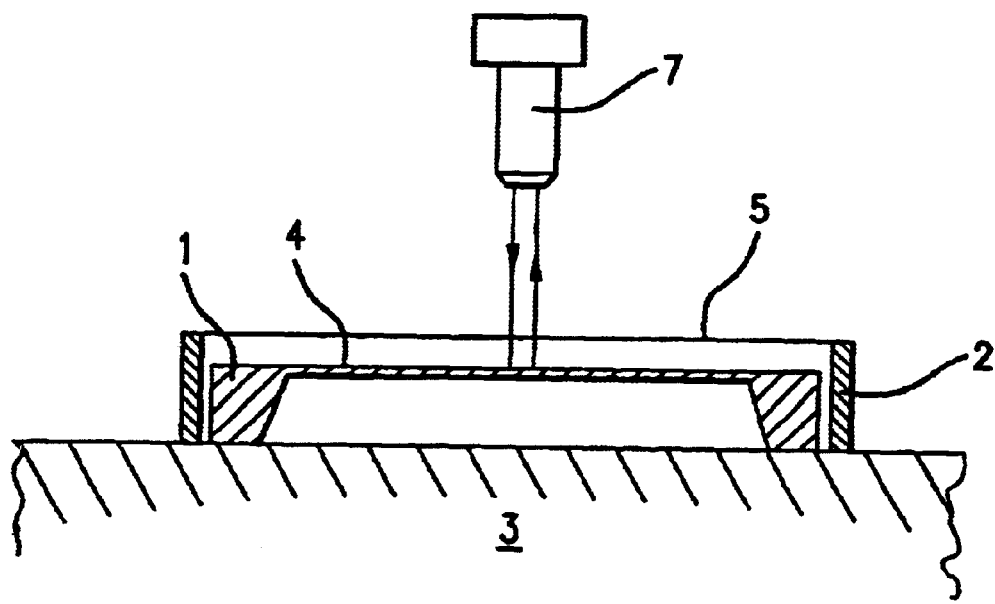
FIG. 4 is a schematic side view of an assembly of the membrane and the pellicle on a base in cooperation with the device for optically measuring the semiconductor membrane.

FIG. 4 discloses the device 7 for optically measuring the semiconductor membrane 4. The device 7 focuses through the pellicle film 5 of the pellicle 2. The semiconductor membrane 4 is optically measured and the semiconductor membrane 4 of the stencil mask 1 is shielded from external vibrations by the pellicle margin and the base 3, which is a non-oscillatory semiconductor substrate or a quartz glass substrate.

We claim:

1. A membrane measurement method, which comprises:
providing a semiconductor membrane in an environment subjecting the semiconductor membrane to oscillatory excitations selected from the group comprising gas flows and acoustic excitations;
providing an optically transparent film and arranging the semiconductor membrane and the film such that the oscillatory excitations reach the semiconductor membrane substantially only through the film; and
focusing a device, for optically measuring the membrane, onto the membrane and thereby measuring the membrane.

2. The method according to claim 1, wherein the oscillatory membrane is a structured membrane.

3. The method according to claim 1, which comprises placing the membrane on a base that is substantially impermeable to the oscillatory excitations, and covering the membrane with the film such that the membrane is encapsulated by the base and the film.

4. The method according to claim 3, wherein the base is formed with a closed, non-oscillatory plane surface beneath the membrane.

5. The method according to claim 1, wherein the optically transparent film essentially consists of nitro-cellulose.

6. The method according to claim 1, wherein the optically transparent film has a thickness of 5 µm.

7. The method according to claim 1, wherein the film is a pellicle.

8. The method according to claim 1, wherein the membrane is a stencil mask.

9. The method according to claim 8, which comprises providing a stencil mask essentially consisting of silicon.

10. The method according to claim 1, which comprises mounting the membrane horizontally, and measuring lateral position deviations of membrane structures.

11. The method according to claim 1, which comprises measuring the membrane with a device for measuring chrome masks.

12. The method according to claim 1, which comprises measuring the membrane with a device for measuring non-oscillatory semiconductor substrates.

13. A membrane measurement method, which comprises:

providing an oscillatory membrane in an environment with oscillatory excitations selected from the group comprising gas flows and acoustic excitations;

placing the oscillatory membrane in a pellicle for one of damping and shielding the membrane against the oscillatory excitations; and focusing a device, for optically measuring the membrane, onto the membrane, and thereby measuring the membrane.

14. A membrane measurement method, which comprises:

providing a semiconductor membrane in an environment subjecting the semiconductor membrane to oscillatory excitations selected from the group comprising gas flows and acoustic excitations;

providing an optically transparent film and arranging the semiconductor membrane and the film such that the oscillatory excitations reach the semiconductor membrane substantially only through the film; and focusing a device, for optically measuring the membrane, onto the membrane and thereby measuring the membrane.

15. The method according to claim 14, wherein the oscillatory semiconductor membrane is a structured membrane.

16. The method according to claim 14, which comprises placing the semiconductor membrane on a base that is substantially impermeable to the oscillatory excitations, and covering the semiconductor membrane with the film such that the membrane is encapsulated by the base and the film.

17. The method according to claim 16, wherein the base is formed with a closed, non-oscillatory plane surface beneath the semiconductor membrane.

18. The method according to claim 14, which comprises mounting the semiconductor membrane horizontally, and measuring lateral position deviations of semiconductor membrane structures.

19. The method according to claim 14, which comprises measuring the semiconductor membrane with a device for measuring chrome masks.

20. The method according to claim 14, which comprises measuring the semiconductor membrane with a device for measuring non-oscillatory semiconductor substrates.

* * * * *